United States Patent [19]
Tai et al.

[11] Patent Number: 5,495,437
[45] Date of Patent: Feb. 27, 1996

[54] NON-VOLATILE RAM TRANSFERRING DATA BETWEEN FERRO-ELECTRIC CAPACITORS AND A MEMORY CELL

[75] Inventors: Jy-Der D. Tai, Phoenix; Andreas A. Wild, Scottsdale, both of Ariz.

[73] Assignee: Motorola, Inc., Schaumburg, Ill.

[21] Appl. No.: 270,274

[22] Filed: Jul. 5, 1994

[51] Int. Cl.[6] .................................................. G11C 11/22
[52] U.S. Cl. ............................ 365/145; 365/149; 365/156
[58] Field of Search .................................... 365/145, 149, 365/154, 156, 228

[56] References Cited

U.S. PATENT DOCUMENTS 4,974,204  11/1990  Miller ..................................... 365/145
5,198,706  3/1993  Papaliolios ............................ 361/145
5,218,566  6/1993  Papaliolios ............................ 365/145

*Primary Examiner*—A. Zarabian
*Attorney, Agent, or Firm*—Robert D. Atkins

[57] ABSTRACT

A non-volatile RAM circuit (10) uses ferro-electric capacitors (14, 16) to store data in a dormant state. Data is initially stored on the ferro-electric capacitors. The data stored on the ferro-electric capacitors is transferred to a memory cell (25) when the RAM circuit is powered up. Subsequent read operations after the power-up sequence obtain data from the memory cell instead of the ferro-electric capacitors. Any write operation during the power-up sequence is stored in the memory cell. When power is removed, the ferro-electric capacitors are updated with the present state of the memory cell. The endurance and data retention time of the ferro-electic capacitors increases by accessing data from the memory cell.

6 Claims, 2 Drawing Sheets

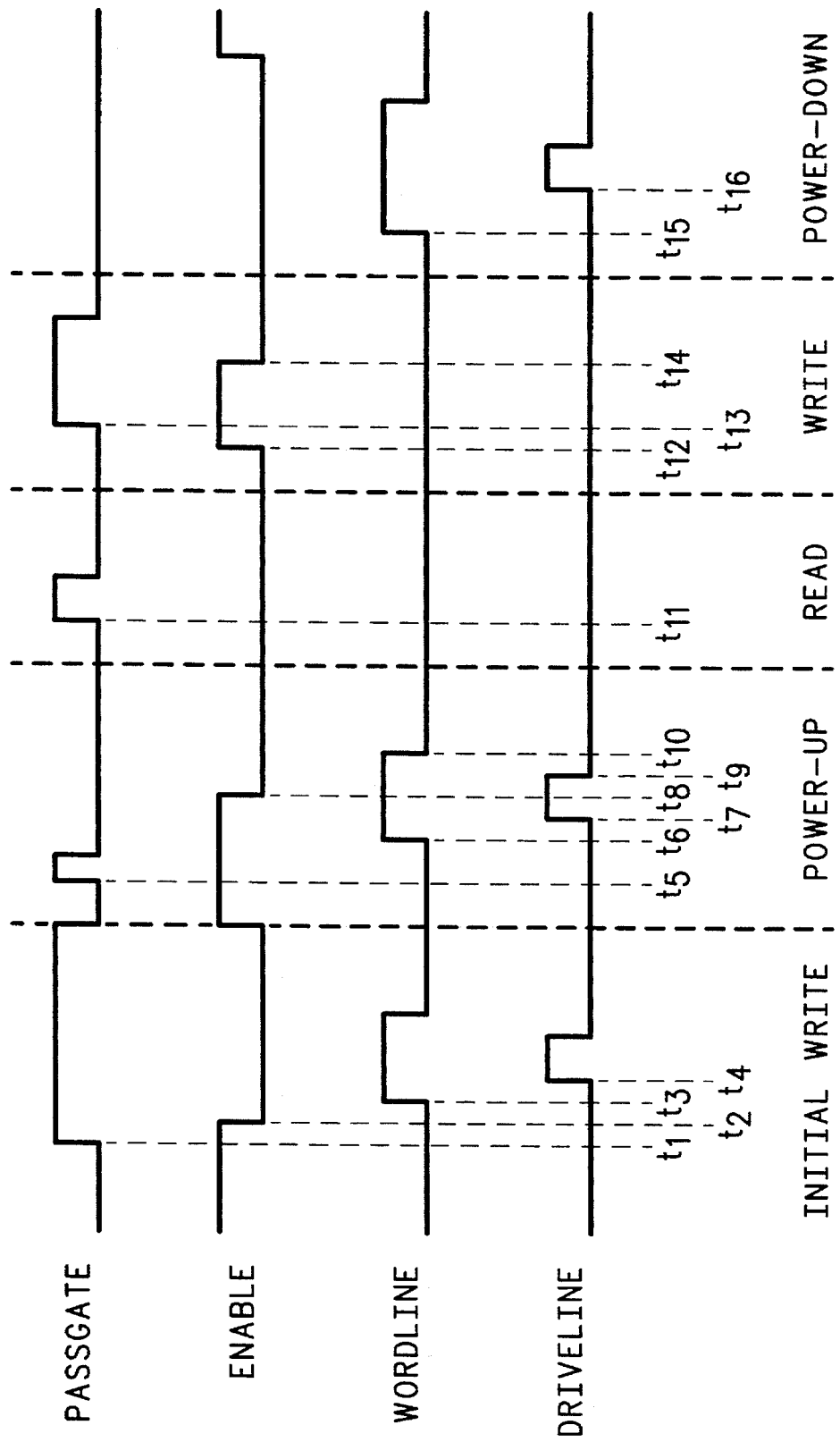

NON-VOLATILE RAM TRANSFERRING DATA BETWEEN FERRO-ELECTRIC CAPACITORS AND A MEMORY CELL

BACKGROUND OF THE INVENTION

The present invention relates in general to semiconductor memories and, more particularly, to a non-volatile semiconductor memory made with ferro-electric capacitors.

Semiconductor memories are used in a myriad of applications to store data for later retrieval and usage. Many applications require the memory to be non-volatile in that the data must remain valid for a long period of time even when external power is removed from the memory cell. One such application involves the use of tag memory where one or more memory cells are placed on an item, e.g. personal luggage, that does not have a power source. The tag memory on the luggage may be accessed, for example at airports and depots, to make identification as to the owner and destination. An RF signal is transmitted remotely from a reader to access the tag memory. Some of the received RF transmission signal power energizes the tag memory cell so that the data may be retrieved and transmitted back to the reader. The tag memory must be non-volatile since it remains dormant for long periods of time between accesses.

In the prior art, ferro-electric capacitors have been used as the non-volatile memory storage element. However, the number of available data accesses is limited because the ferro-electric property degrades with each memory access cycle. Most if not all ferro-electric memory structures drive the ferro-electric material completely around its hysteresis loop every time the ferro-electric memory cell is accessed. Thus, with the ferro-electric capacitors used as the non-volatile memory storage element, the continuous memory cycling leads to an unnecessary amount of polarization domain switching that also causes excessive power consumption by the ferro-electric cell and reduces the endurance and data retention time of the memory circuit.

Hence, a need exists for a non-volatile storage device that can be accessed remotely while retaining data for long periods of time.

BRIEF DESCRIPTION OF THE DRAWING

FIG. 3 is a waveform plot useful in the explanation of FIG. 1.

DETAILED DESCRIPTION OF THE PREFERRED EMBODIMENT

Figure 1:
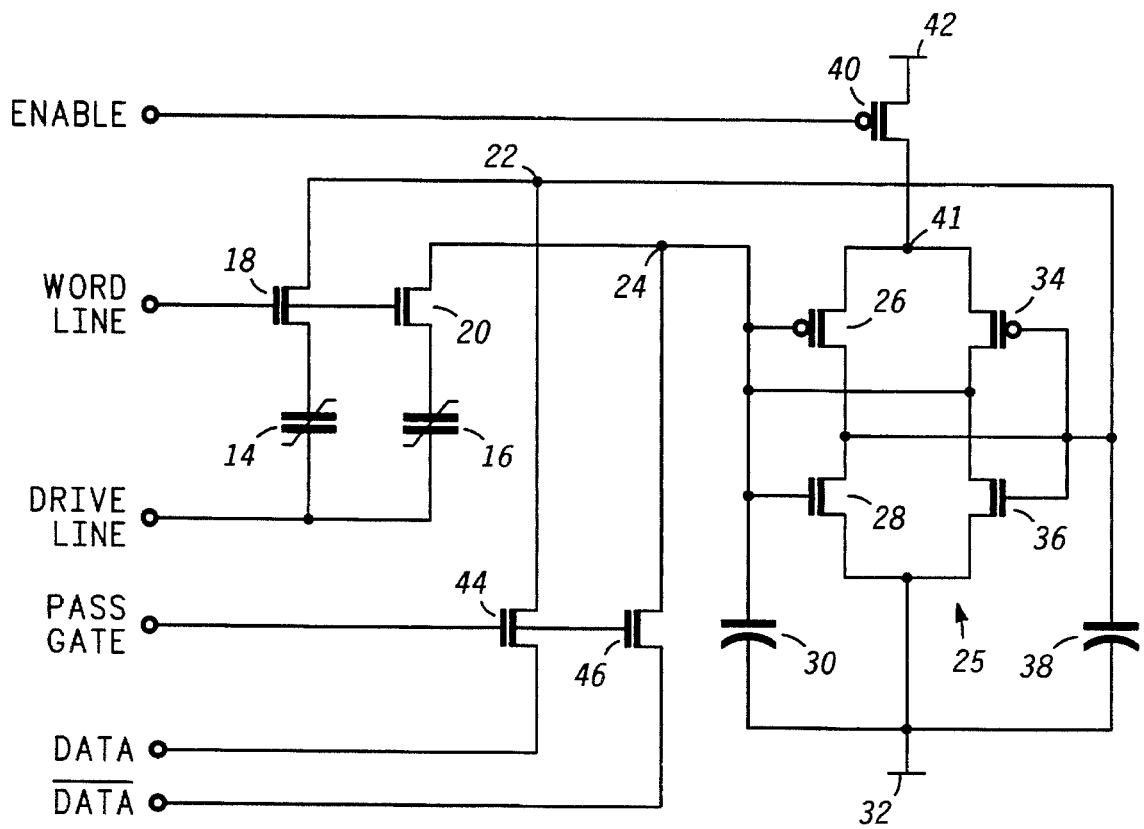
FIG. 1 is a schematic diagram illustrating a ferro-electric RAM circuit.

Referring to FIG. 1, a non-volatile RAM circuit 10 is shown receiving control signals ENABLE, WORDLINE, DRIVELINE, and PASSGATE generated by a control circuit (not shown). RAM circuit 10 is useful in applications such as tag memory where one or more memory cells are placed on an item that does not have a power source, for example personal luggage. The tag memory may be accessed with an RF signal transmitted remotely from a reader (not shown). Some of the received RF transmission signal power energizes RAM circuit 10 so that the data may be retrieved and transmitted back to the reader. The tag memory must be non-volatile since it remains dormant for long periods of time between accesses.

Ferro-electric capacitors 14 and 16 receive the DRIVELINE control signal at one common terminal. Capacitors 14 and 16 are each selected at one picofarad (pf). A second terminal of ferro-electric capacitor 14 is coupled to the source of transistor 18, while a second terminal of ferro-electric capacitor 16 is coupled to the source of transistor 20. The gates of transistors 18 and 20 receive the WORDLINE control signal. The drains of transistors 18 and 20 are coupled to data bitlines 22 and 24, respectively.

A memory cell 25 includes first and second terminals coupled to data bitlines 22 and 24. Transistors 26 and 28 of memory cell 25 form a first inverter. The gates of transistors 26 and 28 form the first terminal of memory cell 25 that is coupled to data bitline 24. Capacitor 30 is coupled between bitline 24 and power supply conductor 32 operating at ground potential. The drain of transistor 26 is coupled to the drain of transistor 28 at bitline 22, while the source of transistor 28 is coupled to power supply conductor 32. Transistors 34 and 36 of memory cell 25 form a second inverter. The gates of transistors 34 and 36 form the second terminal of memory cell 25 that is coupled to data bitline 22. The drain of transistor 34 is coupled to the drain of transistor 36 which is further coupled to bitline 24. The source of transistor 36 is coupled to power supply conductor 32. Capacitor 38 is coupled between bitline 22 and power supply conductor 32. Capacitors 30 and 38 are each selected at ten pf. Memory cell 25 is enabled by transistor 40 having a drain coupled to the sources of transistors 26 and 34 at node 41, and a source coupled to power supply conductor 42 operating at a positive potential $V_{DD}$ such as 3.0 volts. Transistors 44 and 46 operate as pass transistors to couple complementary data signals DATA and $\overline{DATA}$ to bitlines 22 and 24, respectively. The gates of transistors 44 and 46 receive the PASSGATE control signal.

Figure 2:
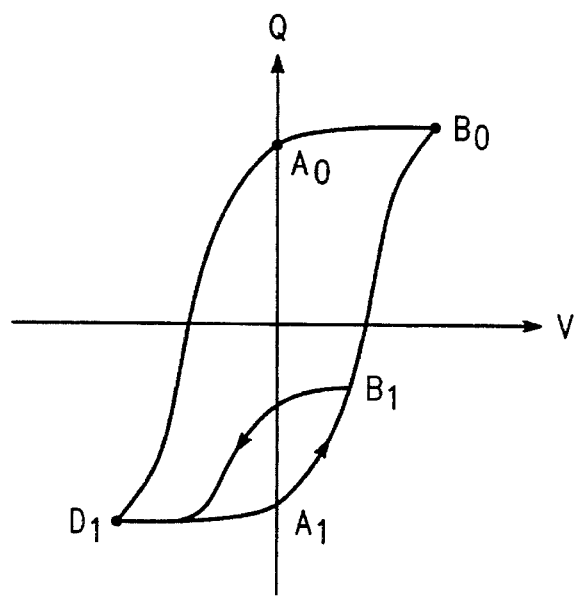
FIG. 2 is a plot of the hysteresis loop of the ferro-electric capacitors of FIG. 1.

To better understand the operation of RAM circuit 10, the field-polarization characteristic curve of ferro-electric capacitors 14 and 16 is shown in FIG. 2 with variable voltage V as applied across the capacitor plates plotted against the electric charge Q on the capacitor plates. It is known that ferro-electric materials exhibit hysteresis. In the absence of the applied voltage V, the capacitor charge Q rests in quiescent charge state $A_0$ or quiescent charge state $A_1$ depending upon the last applied voltage. The ferro-electric material in the capacitors can be brought to a known state, $A_0$ or $A_1$, by applying a voltage pulse of proper amplitude in the desired polarity. Capacitors 14 and 16 maintain that quiescent state for an extended period, in the absence of counter external stresses like an opposite polarity voltage pulse or high temperature.

In order to determine the state of the ferro-electric material, another pulse having arbitrary sense is applied. Suppose that the ferro-electric material was initially brought to state $A_0$ and a positive pulse is applied. The state of the ferro-electric material moves from state $A_0$ to state $B_0$ on the raising edge of the positive pulse and returns to state $A_0$ on the falling edge of the positive pulse. A very small amount of charge is generated when the ferro-electric polarization moves from state $A_0$ to state $B_0$. State $B_0$ indicates the ferro-electric capacitor operating with a positive charge and a positive voltage across its plates. However, if the ferro-electric material was initially brought to state $A_1$, then it moves from state $A_1$ to state $B_1$ on the raising edge of the positive pulse and back to state $A_1$ on the falling edge of the positive pulse. In the latter case, a larger amount of charge Q is observed at the terminals of the capacitor. The amount charge Q generated in response to a positive read pulse distinguishes between the two initial states of the ferroelectric material in the capacitor.

In the prior art, the read operation is destructive in bringing all ferro-electric materials to state $B_0$. It is necessary to restore the initial state after each read operation. Unfortunately, all the known ferro-electric materials have a limited endurance, i.e. ability to maintain its hysteresis property. The field-polarization characteristics tend to degrade after about $10^7$ to $10^8$ read cycles.

As part of the present invention, in order to reduce the number of cycles, memory cell 25 is used in conjunction with ferro-electric capacitors 14 and 16. The information is stored across capacitors 14 and 16 when there is no power supply to RAM circuit 10. At power up, the data stored across the ferro-electric capacitors is transferred to memory cell 25 after which the ferro-electric capacitors are disconnected from the circuit by disabling transistors 18 and 20. All subsequent read and write operations after the power-up sequence address memory cell 25. By removing capacitors 14 and 16 from the circuit operation, the field-polarization characteristics degrades with the power-up/power-down cycles rather than by memory accesses cycles. There are far fewer power-up/power-down cycles than memory access cycles in most applications. Hence, the endurance and data retention time of ferro-electric capacitors 14 and 16 in the present invention is much longer than prior art applications that use of ferro-electric capacitors as the primary memory storage element. At power down, the most recent data stored in memory cell 25 is transferred back to ferro-electric capacitors 14 and 16.

First consider an initial write operation to ferro-electric capacitors 14 and 16 as follows. Assume a positive power supply potential $V_{DD}$ is applied to conductor 42 and complementary data signals are present as DATA and $\overline{\text{DATA}}$. As shown in FIG. 3 at time $t_1$, the PASSGATE control signal goes high to turn on transistors 44 and 46 and transfer the data to bitlines 22 and 24. At time $t_2$, ENABLE goes low to turn on transistor 40 and enable memory cell 25 during the initial write. Memory cell 25 receives the same data the ferro-electric capacitors during the initial write in case read cycles follow during the same power-on sequence, see the read cycle discussion below. The WORDLINE control signal goes high at time $t_3$ to enable transistors 18 and 20 and connect the second terminals of ferro-electric capacitors 14 and 16 to bitlines 22 and 24. At time $t_4$, the DRIVELINE control signal pulses high to store a charge across ferro-electric capacitors 14 and 16 as determined by the data signals on bitlines 22 and 24. For example, assume that the DATA signal is logic one while the $\overline{\text{DATA}}$ signal is logic zero. The plate of capacitor 14 nearest transistor 18 receives a positive charge Q from the logic one DATA signal and the high DRIVELINE control signal and assumes state $A_1$. The plate of capacitor 16 nearest transistor 20 receives a less positive charge Q due to the logic zero $\overline{\text{DATA}}$ signal and the high DRIVELINE control signal and assumes state $A_0$. Thus, capacitors 14 and 16 are configured differentially in opposite states. RAM circuit 10 goes dormant with the data stored across ferro-electric capacitors 14 and 16 when the positive power supply potential $V_{DD}$ is removed.

Next consider a power-up and read request to RAM circuit 10. RAM circuit 10 begins in a dormant state without any power supply potential. An RF signal is transmitted remotely by a reader and picked by an RF receiver (not shown). Some of the received RF signal power provides the 3.0 volt operating potential to power supply conductor 42. During power-up, the DATA and $\overline{\text{DATA}}$ signals are both logic zero to eliminate any residual voltage left on capacitors 14 or 16 by the previous switching cycle. The PASSGATE control signal pulses high at time $t_5$ to turn on transistors 44 and 46 and pull bitlines 22 and 24 to logic zero. The PASSGATE control signal goes low to disable transistors 44 and 46 and remove the logic zero on bitlines 22 and 24 before time $t_6$ when the WORDLINE control signal goes high to enable transistors 18 and 20 and connect capacitors 14 and 16 to bitlines 22 and 24. The DRIVELINE control signal pulses high at time $t_7$ to develop voltages across capacitors 14 and 16 and transfer charge to extraction capacitors 30 and 38, respectively. The ENABLE control signal remains logic one to keep memory cell 25 deactivated until bitlines 22 and 24 have assumed the logic states stored on capacitors 14 and 16.

As shown in FIG. 2, ferro-electric capacitor 16 moves from state $A_0$ to state $B_0$ when the DRIVELINE control signal goes to 3.0 volts and develops a positive voltage across capacitor 16. Capacitor 16 provides a very small amount of charge to capacitor 30. The voltage across capacitor 16 is about 2.7 volts and the voltage across capacitor 30 is about 0.3 volts following the DRIVELINE pulse. Since capacitor 14 provides more charge to capacitor 38, the voltage across capacitor 38 is greater than that of capacitor 30 by approximately 0.7 volts. The voltage across capacitor 14 is about 2.0 volts, while the voltage across capacitor 38 is about 1.0 volts following the DRIVELINE pulse.

Memory cell 25 operates as a sense amplifier. A difference of 0.7 volts develops between the gates of transistors 28 and 36. Transistor 36 turns on and pulls bitline 24 low. Transistors 26 turns on while transistors 28 and 34 are off. Although capacitor 14 starting at state $A_1$ has more to discharge to reach positive 3.0 volts on the hysteresis curve, it does not reach state $B_0$ because transistor 40 is still off at time $t_7$ thereby disabling the conduction paths through memory cell 25. The voltage at bitline 22 is limited to the 1.0 volt across capacitor 38. Ferro-electric capacitor 14 moves from state $A_1$ to state $B_1$. At time $t_8$, the ENABLE control signal goes low while the DRIVELINE is high and turns on transistor 40. Transistor 26 pulls bitline 22 to logic one, while transistor 36 keeps bitline 24 at logic zero. Thus, memory cell 25 amplifies the voltages on extraction capacitors 30 and 38 to full logic states on bitlines 22 and 24. The voltage across capacitor 14 goes to zero with 3.0 volts on bitline 22. Bitline 24 remains at logic zero and capacitor 16 remains at state $B_0$.

At time $t_9$, the DRIVELINE control signal returns to logic zero and creates −3.0 volts across capacitor 14. Capacitor 14 moves to state $D_1$. Capacitor 16 now has zero voltage across its terminals and therefore returns to state $A_0$, thereby refreshing capacitor 16. The WORDLINE control signal returns to logic zero at time $t_{10}$ to turn off transistors 18 and 20 and isolate ferro-electric capacitors 14 and 16 from memory cell 25. Capacitor 14 returns to state $A_1$ which refreshes capacitor 14 as the voltage across its terminals goes to zero volts. The aforedescribed power-up sequence has transferred the data stored on capacitors 14 and 16 to memory cell 25 while refreshing the ferro-electric material.

During a read cycle, the ENABLE control signal remains low to keep memory cell 25 active. The PASSGATE control signal is initially low to keep transistors 44 and 46 off and block access to DATA and $\overline{\text{DATA}}$. The PASSGATE control signal goes high at time $t_{11}$ to enable transistors 44 and 46 and allow the data stored by memory cell 25 to be transferred to DATA and $\overline{\text{DATA}}$. The WORDLINE and DRIVELINE control signals remain idle during the read cycle. Consequently, the read cycle does not access ferro-electric capacitors 14 and 16 and cycle the ferro-electric material around its hysteresis loop. As noted above, transferring charge from the ferro-electric material reduces its endurance, i.e. its ability to maintain hysteresis properties for a long period of time. By reading data directly from memory cell 25, the endurance of ferro-electric capacitors 14 and 16 is increased because they are infrequently accessed only during power-up and power-down phases of operation.

To write data to RAM circuit 10 during a power-up sequence, the ENABLE control signal goes high at time $t_{12}$ to disable memory cell 25 and allow bitlines 22 and 24 to float. The PASSGATE control signal goes high at time $t_{13}$ to enable transistors 44 and 46 and pass the DATA and DATA signals and set the states of bitlines 22 and 24 accordingly. When the ENABLE control signal returns low at time $t_{14}$, memory cell 25 assumes the states of bitlines 22 and 24 as discussed above. The data stored in memory cell 24 may be read by enabling transistors 44 and 46 during a read cycle.

The final option for RAM circuit 10 involves power-down where the power supply potential is removed and the circuit returns to a dormant state. While the ENABLE control signal is low, the WORDLINE control signal goes high at time $t_{15}$ to enable transistors 18 and 20. The DRIVELINE control signal pulses high at time $t_{16}$ to store the most recent state of bitlines 22 and 24 on ferro-electric capacitors 14 and 16. RAM circuit 10 powers down with the data stored on the non-volatile ferro-electric material.

By now it should be appreciated that the present invention provides a non-volatile RAM circuit using ferro-electric capacitors to store data in a dormant state. Data is initially stored on the ferro-electric capacitors. The data stored on the ferro-electric capacitors is transferred to a memory cell when the RAM circuit is powered up. Subsequent read operations during the power-up sequence obtain data from the memory cell instead of the ferro-electric capacitors. Any write operation during the power-up sequence is stored in the memory cell. When power is removed, the ferro-electric capacitors are updated with the present state of the memory cell. The data retention time of the ferro-electric capacitors increases by accessing data from the memory cell.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A ferro-electric RAM circuit, comprising:

a memory cell having first and second data bitlines;

a first capacitor coupled between said first data bitline and a first power supply conductor;

a second capacitor coupled between said second data bitline and said first power supply conductor;

first means for coupling first and second complementary data signals to said first and second data bitlines respectively in response to a passgate control signal;

third and fourth capacitors each having first and second terminals, said first terminals receiving a driveline control signal; and second means for coupling said second terminals of said third and fourth capacitors to said first and second data bitlines respectively in response to a wordline control signal;

where said memory cell includes, (a) a first transistor having a gate, a drain and a source, said gate being coupled to said second data bitline, said drain being coupled to said first data bitline, (b) a second transistor having a gate, a drain and a source, said drain being coupled to said first data bitline, said gate being coupled to said second data bitline, said source being coupled to said first power supply conductor, (c) a third transistor having a gate, a drain and a source, said gate being coupled to said first data bitline, said drain being coupled to said second data bitline, (d) a fourth transistor having a gate, a drain and a source, said drain being coupled to said second data bitline, said gate being coupled to said first data bitline, said source being coupled to said first power supply conductor, and (e) a fifth transistor having a gate, a drain and a source, said source being coupled to a second power supply conductor, said gate being coupled for receiving an enable control signal, said drain being coupled to said sources of said first and third transistors for isolating said sources of said first and third transistors from said second power supply conductor and allowing a maximum difference voltage to develop between said first and second data bit lines.

2. The ferro-electric RAM circuit of claim 1 wherein said third and fourth capacitors are made of a ferro-electric material.

3. The ferro-electric RAM circuit of claim 2 wherein said first means includes a sixth transistor having a gate, a drain and a source, said drain being coupled to said first data bitline, said gate being coupled for receiving said passgate control signal, said source being coupled for receiving said first complementary data signal.

4. The ferro-electric RAM circuit of claim 3 wherein said first means further includes a seventh transistor having a gate, a drain and a source, said drain being coupled to said second data bitline, said gate being coupled for receiving said passgate control signal, said source being coupled for receiving said second complementary data signal.

5. The ferro-electric RAM circuit of claim 4 wherein said second means includes an eighth transistor having a gate, a drain and a source, said drain being coupled to said first data bitline, said gate being coupled for receiving said wordline control signal, said source being coupled to said second terminal of said third capacitor.

6. The ferro-electric RAM circuit of claim 5 wherein said second means further includes a ninth transistor having a gate, a drain and a source, said drain being coupled to said second data bitline, said gate being coupled for receiving said wordline control signal, said source being coupled to said second terminal of said fourth capacitor.

* * * * *